United States Patent [19]

Yuen

[11] Patent Number: 5,952,851
[45] Date of Patent: Sep. 14, 1999

[54] BOOSTED VOLTAGE DRIVER

[75] Inventor: Guy S. Yuen, San Jose, Calif.

[73] Assignee: Programmable Microelectronics Corporation, San Jose, Calif.

[21] Appl. No.: 08/931,116

[22] Filed: Sep. 16, 1997

[51] Int. Cl.[6] .............................................. H03K 19/0185
[52] U.S. Cl. .................................. 326/88; 326/86; 326/83
[58] Field of Search .................................. 326/80, 81, 83, 326/86, 88, 68, 93, 95, 98

[56] References Cited

U.S. PATENT DOCUMENTS

| | | | |
|---|---|---|---|
| 4,346,310 | 8/1982 | Carter | 326/88 |
| 4,574,203 | 3/1986 | Baba . | |
| 4,680,488 | 7/1987 | Okumura et al. | 326/88 |
| 4,689,505 | 8/1987 | Ghoshal | 326/88 |
| 5,008,568 | 4/1991 | Leung et al. | 326/83 |
| 5,134,317 | 7/1992 | Ohta | 326/98 |
| 5,493,233 | 2/1996 | Shigehara et al. | 326/81 |
| 5,576,635 | 11/1996 | Partovi et al. | 326/83 |
| 5,589,793 | 12/1996 | Kassapian . | |
| 5,594,380 | 1/1997 | Nam | 326/88 |

*Primary Examiner*—Jon Santamauro
*Assistant Examiner*—Dom Phu Le
*Attorney, Agent, or Firm*—Flehr Hohbach Test Albritton & Herbert LLP

[57] ABSTRACT

A circuit for generating a boosted voltage includes a logic portion and a switching portion. The logic portion is coupled to receive a clock signal and, in response thereto, provides control signals to an associated switching circuit. During a first portion of the clock signal cycle, the switching circuit pulls an output terminal of the circuit to the supply voltage. During a second portion of the clock signal cycle, the switching circuit utilizes a bootstrap capacitor to boost the output terminal of the circuit to approximately twice the supply voltage, while isolating the output terminal from the supply voltage.

20 Claims, 4 Drawing Sheets

BOOSTED VOLTAGE DRIVER

BACKGROUND

1. Field of Invention

This invention relates generally to semiconductor memories and specifically to circuits for providing a boosted voltage.

2. Description of Related Art

Many circuits such as, for instance, charge pumps, various MOS memory arrays, and so on, require a boosted input voltage for proper operation. A circuit which provides a boosted voltage of the type disclosed in U.S. Pat. No. 4,574,203, issued Mar. 4, 1986 to Baba, is shown in FIG. 1. Circuit 10 is coupled to receive an input clock signal IN and includes a PMOS pull-up transistor 12 coupled between a supply voltage $V_{DD}$ and an output terminal OUT and an NMOS pull-down transistor 14 coupled between the output terminal OUT and ground potential. The circuit 10 further includes a bootstrap capacitor C, a switch formed by a PMOS transistor 16 and an NMOS transistor 18, an inverter INV, and delay circuits D1 and D2. The gate of the pull-down transistor is coupled to receive the input clock signal IN. The gates of the switch transistors 16 and 18 are coupled to receive a delayed clock signal, and the capacitor is coupled to receive a further delayed and inverted clock signal. When the delayed clock signal reaches a first level, transistor 18 connects the gates of transistors 12 and 14 together, thereby pulling the output terminal OUT to approximately the supply voltage $V_{DD}$. When the delayed clock signal reaches a second level, transistor 16 connects the gate of transistor 12 to the output terminal OUT, thereby allowing the bootstrap capacitor to boost the output terminal OUT beyond the supply voltage $V_{DD}$.

The circuit 10 disclosed by Baba boosts the output terminal OUT to approximately $V_{DD}-V_{tP}$, where $V_{tp}$, the threshold voltage of the pull-up transistor 12, is typically between approximately −0.7 and −1.0 volts. Since the pull-up transistor 12 is prone to latch-up or leakage due to forward biasing of the source and well of the transistor 12 at higher voltages, the maximum boosted voltage of the output terminal OUT is limited to approximately $V_{DD}-V_{tp}$.

FIG. 2 shows an output stage of a circuit for generating a boosted voltage of the type disclosed in U.S. Pat. No. 5,589,793, issued Dec. 31, 1996 to Kassapian. Circuit stage 20 includes a NOR gate G6 coupled to receive clock signals OSC and S2 and a delayed clock signal S1r. When the clock signal OSC transitions from high to low, signals S'1 and S2 transition from high to low, while signals S1 and S1r remain low. The output of logic gate transitions high, thereby turning on transistor Q1 which, in turn, charges capacitor C5 to a maximum voltage of $V_{cc}-V_{th}$, where $V_{th}$ is the threshold voltage of transistor Q1. Signal S1 then transitions from low to high, followed by the transitioning of signal S1r from low to high. As a result, transistor Q1 turns off and thereby isolates the output Phi1b from the supply voltage $V_{cc}$. The output Phi1b is boosted by the charge on capacitor C5 to a maximum voltage of $2V_{cc}-V_{th}$. Since at low voltages the maximum output voltage of the circuit stage 20, i.e., $2V_{cc}-V_{th}$, is dominated by the threshold voltage $V_{th}$, the Kassapian circuit is not well suited for low voltage applications. For instance, where $V_{cc}$ is equal to 1.5 volts, the maximum boosted voltage of the Kassapian circuit is only between approximately 2.0–2.3 volts.

SUMMARY

A novel circuit for generating a boosted voltage is disclosed. In accordance with the present invention, the circuit includes a logic portion and a switching portion. The logic portion is coupled to receive a clock signal and, in response thereto, provides control signals to the switching circuit. During a first portion of the clock signal cycle, the switching circuit pulls an output terminal of the circuit to the supply voltage. During a second portion of the clock signal cycle, the switching circuit utilizes a bootstrap capacitor to boost the output terminal of the circuit to approximately twice the supply voltage, while simultaneously isolating the output terminal from the supply voltage.

DETAILED DESCRIPTION

Embodiments of the present invention, which may be used to drive any circuit such as, for instance, a charge pump, which requires an input voltage exceeding the supply voltage, are discussed below in the context of a circuit 100 for simplicity only. Thus, the present invention should not be construed as limited to the circuit 100.

Figure 1:
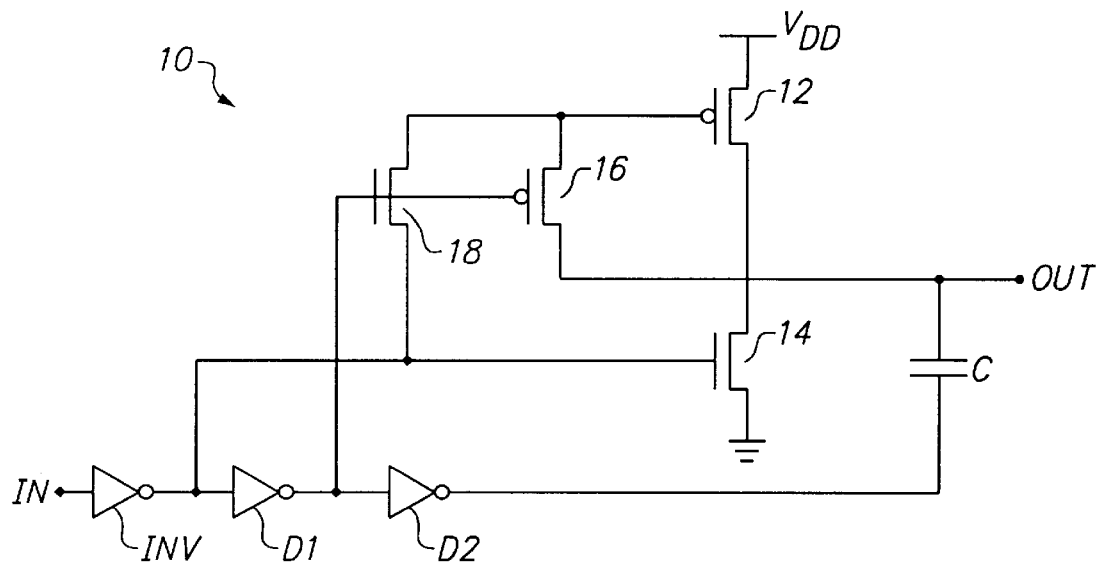
FIG. 1 is a schematic diagram of a conventional circuit for generating a boosted voltage.
Figure 3:
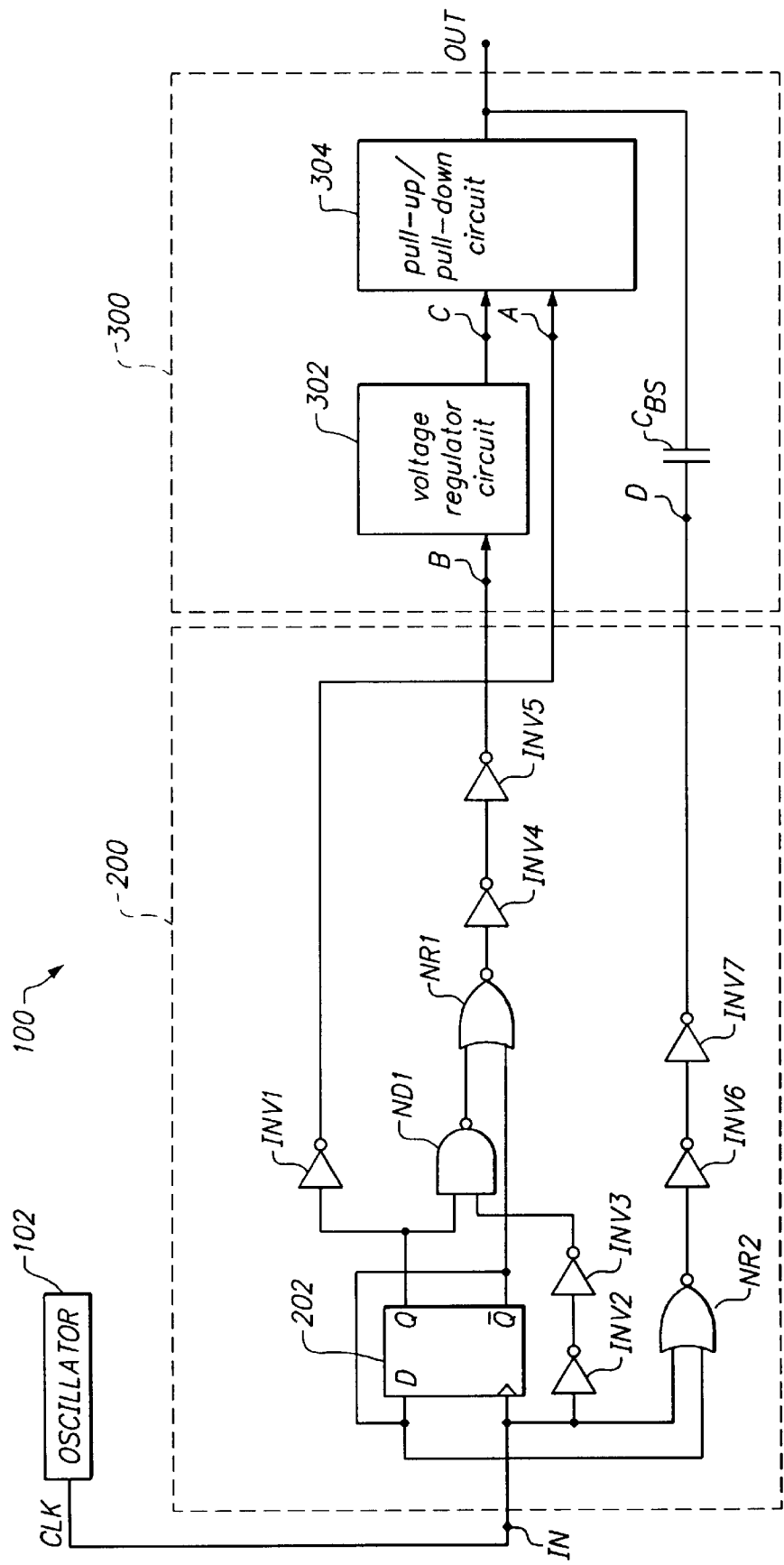
FIGS. 3 and 4 are schematic diagrams of a circuit for generating boosted voltages in accordance with the present invention.

Referring now to FIG. 3, the circuit 100 includes an input terminal IN, a logic portion 200, a switching portion 300, and an output terminal OUT. The input terminal IN is coupled to receive a clock signal CLK from a suitable clock generating circuit such as, for instance, the oscillator 102 shown in FIG. 1. The logic portion 200, which has a number of logic gates, including a data flip-flop 202, logic inverters INV1–INV7, a NAND gate ND1, and NOR gates NR1–NR2, as shown in FIG. 3, provides logic signals derived from the clock signal CLK to the switching portion 300 at nodes A, B, and D. In some embodiments, the inverters are conventional CMOS inverters having a voltage swing equal to the supply voltage $V_{DD}$. As will be discussed in detail below, the specific configuration of, and thus the operation of, the logic portion 200 may vary depending upon desired operating characteristics of the circuit 100, as well as upon the operating specifications of a circuit (not shown) such as, for instance, a charge pump, coupled to the output terminal OUT of the circuit 100.

The switching portion 300 includes a voltage regulator circuit 302, a pull-up/pull-down circuit 304, and a bootstrap capacitor $C_{BS}$. In preferred embodiments, the bootstrap capacitor $C_{BS}$ is formed by an NMOS transistor having a commonly coupled source and drain, although any suitable capacitive structure may be employed for the bootstrap capacitor $C_{BS}$. The pull-up/pull-down circuit 304 pulls the output terminal OUT to the supply voltage $V_{DD}$ when the control signal received at node A is low, i.e., at ground potential. The output terminal OUT is boosted to approximately $2V_{DD}$ when the control signal received at node D transitions high, i.e., to $V_{DD}$. The pull-up/pull-down circuit 304 discharges the output terminal OUT to ground potential when the control signal received at node A transitions high, i.e., to $V_{DD}$. The voltage regulator circuit 302 regulates an internal voltage of the pull-up/pull-down circuit 304 via node C in response to the control signal received at node B.

Figure 4:
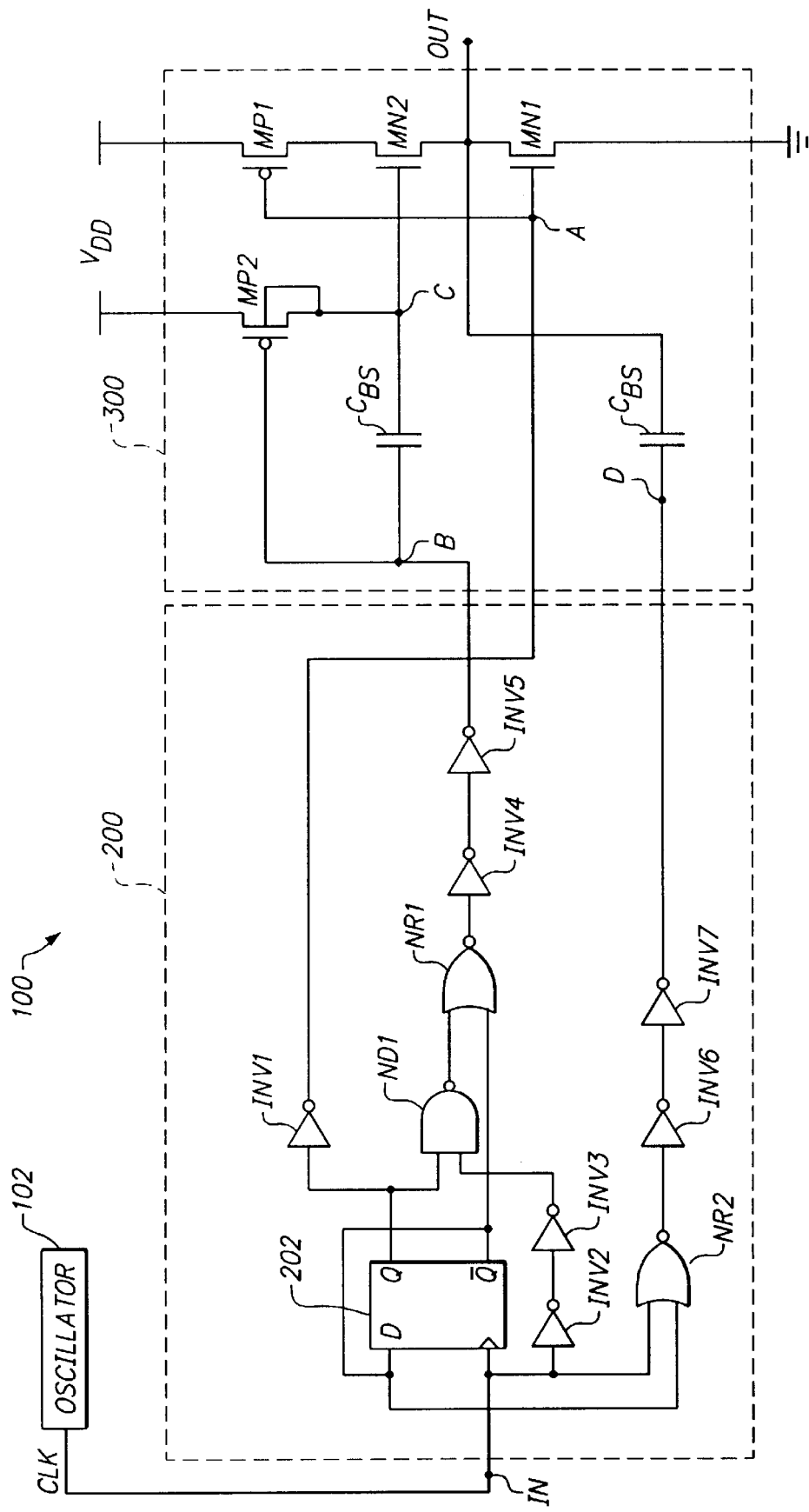

Referring to FIG. 4, in preferred embodiments, the pull-up/pull-down circuit 304 includes a CMOS inverter formed by a PMOS transistor MP1 and an NMOS transistor MN1, and having an NMOS pass transistor MN2 coupled between the transistors MP1 and MN1, where the input and output of the CMOS inverter are taken at node A and output terminal OUT, respectively. The voltage regulator circuit 302 includes a PMOS pull-up transistor MP2 having a source coupled to the supply voltage $V_{DD}$, a gate coupled to node B, and a drain coupled to the gate of the pass transistor MN2, i.e., node C. Preferably, the n– well region within which the voltage regulating transistor MP2 is formed is coupled to node C, as shown in FIG. 4. The voltage regulator circuit 302 also includes a gate-boost capacitor $C_{GB}$. In preferred embodiments, the gate boost capacitor $C_{GB}$ is formed by an NMOS transistor having a commonly coupled source and drain, although any suitable capacitive structure may be employed for the gate boost capacitor $C_{GB}$. The conductivity types of the transistors discussed above may be reversed without departing from the scope of the present invention.

Figure 5:
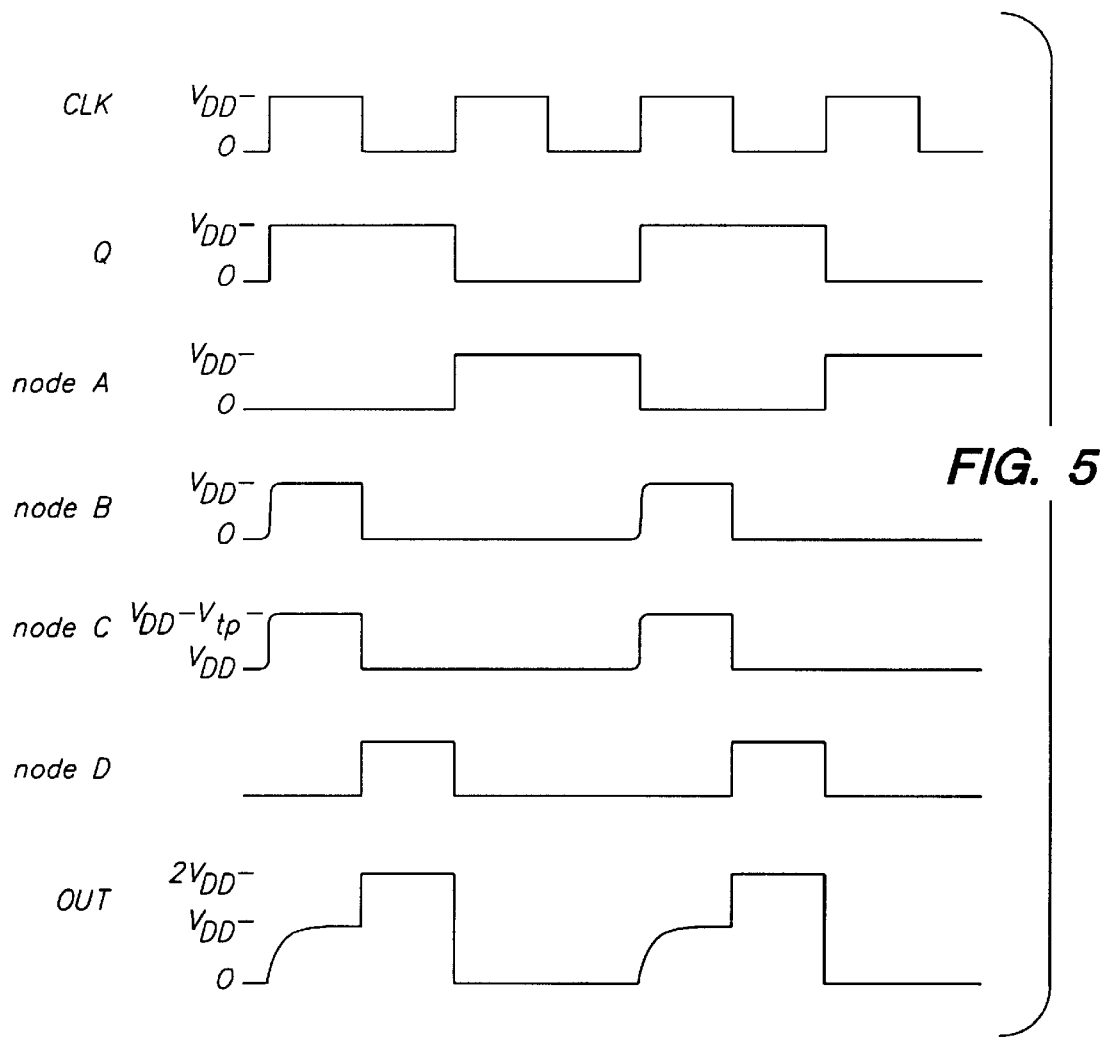
FIG. 5 is a timing diagram illustrating the potential of various nodes of the circuit of FIG. 3 during operation thereof.

The operation of the circuit 100 is described below, with reference to the timing diagram of FIG. 5. Preferably, the clock signal CLK, when in its high state, is at the supply voltage $V_{DD}$ and, when in its low state, is at ground potential. The flip-flop 202 is configured to operate as a divide-by-two circuit, thereby doubling the clock signal CLK. Thus, the signal at the Q output of the flip-flop 202 is generated by doubling the period of the clock signal CLK, as indicated in FIG. 5. The clock signal CLK, and thus the Q output of the flip-flop 202, are initially low, i.e., at ground potential. Accordingly, the $\overline{Q}$ output of the flip-flop 202 is initially high, i.e., at $V_{DD}$, and node A, which is generated by inverting the signal at the Q output of the flip-flop 202 via the inverter INV1, is initially high, i.e., at $V_{DD}$. The pull-up transistor MP1 is initially off and the pull-down transistor MN1 is initially on. As a result, the output terminal OUT of the circuit 100 is initially low, e.g., at ground potential. Node B is initially low, e.g., at ground potential, thereby turning on transistor MP2 which, in turn, pulls the voltage of node C high to $V_{DD}$, thereby charging the gate-boost capacitor $C_{GB}$ to the supply voltage $V_{DD}$. Initially, node D is also low, e.g., at ground potential.

On the first rising edge of the clock signal CLK, the logic high signal at the $\overline{Q}$ output of the flip-flop 202 is latched into the D-input terminal of the flip-flop 202, thereby causing the Q output of the flip-flop 202 to transition high. This high signal is inverted by the inverter INV1 and appears as a logic low signal at node A, thereby turning transistor MP1 on and turning transistor MN1 off. The output terminal OUT begins to rise to $V_{DD}$, as indicated in FIG. 5. The high clock signal CLK simultaneously drives node B high to $V_{DD}$, thereby boosting the gate-boost capacitor $C_{GB}$, and thus node C, above the supply voltage $V_{DD}$. As the voltage on node C increases above $V_{DD}-V_{tp}$, where $V_{tp}$, the threshold voltage of transistor MP2, is between approximately –0.7 and –2.5 volts, transistor MP2 turns on. Thus, node C rises to a voltage equal to or greater than equal to $V_{DD}-V_{tp}$. The maximum voltage to which node C may be driven depends on the threshold voltage $V_{tp}$ and the width-to-length (W/L) dimension ratio of the gate-boost capacitor MN3, as well as on the W/L dimension ratio of the voltage regulating transistor MP2. Driving the gate of the pass transistor MN2 with a voltage approximately equal to $V_{DD}-V_{tP}$ allows the pass transistor to pull the output terminal OUT to $V_{DD}$ without turning off. Otherwise, the pass transistor MN2 may undesirably clamp the output terminal OUT at a voltage below $V_{DD}$. As a result, the output terminal OUT is pulled high to the supply voltage $V_{DD}$, thereby boosting the charge on the bootstrap capacitor $C_{BS}$ to $V_{DD}$.

The clock signal CLK and the $\overline{Q}$ output of the flip-flop 202 are combined in the NOR gate NR2 and then delayed and driven by the inverters INV6 and INV7 before reaching node D. Thus, on the first falling edge of the clock signal CLK, node D is driven from low to high, i.e., from ground potential to $V_{DD}$, thereby boosting the charge on the bootstrap capacitor $C_{BS}$, which was previously charged to $V_{DD}$, to a voltage of approximately $2V_{DD}$. Accordingly, the first falling edge of the clock signal CLK results in the output terminal OUT boosting to approximately $2V_{DD}$, as indicated in FIG. 5.

A delayed clock signal is combined with the Q output of the flip-flop 202 in the NAND gate ND1, the output signal of which is combined with the $\overline{Q}$ output of the flip-flop 202 in the NOR gate NR1. The output signal of the NOR gate NR1 is delayed and driven by the inverters INV4 and INV5 before reaching node B. Accordingly, node B transitions low contemporaneously with the first falling edge of the clock signal CLK, thereby discharging the gate-boost capacitor $C_{GB}$ and turning on transistor MP2. Once conducting, transistor MP2 pulls the gate of the pass transistor MN2, i.e., node C, down to the supply voltage $V_{DD}$. Since the source voltage of the pass transistor MN2 is greater than the gate voltage thereof, i.e., $V_S=2V_{DD}$ and $V_G=V_{DD}$, the pass transistor is strongly turned off and thereby isolates the output terminal OUT from the supply voltage $V_{DD}$. In this manner, the drain of transistor MP1 is prevented from forward biasing which, in turn, could undesirably result in leakage current and latch-up problems.

The next rising edge of the clock signal CLK latches the logic low signal at the $\overline{Q}$ output of the flip-flop 202 into the D input terminal of the flip-flop 202, thereby forcing the Q output of the flip-flop 202 low. As a result, node A is driven high to $V_{DD}$, thereby turning off the pull-up transistor MP1 and turning on the pull-down transistor MN1. Accordingly, the output terminal OUT discharges to ground potential, as indicated in FIG. 5. This process may then be repeated, indefinitely if desired, as shown in FIG. 5.

Figure 2:
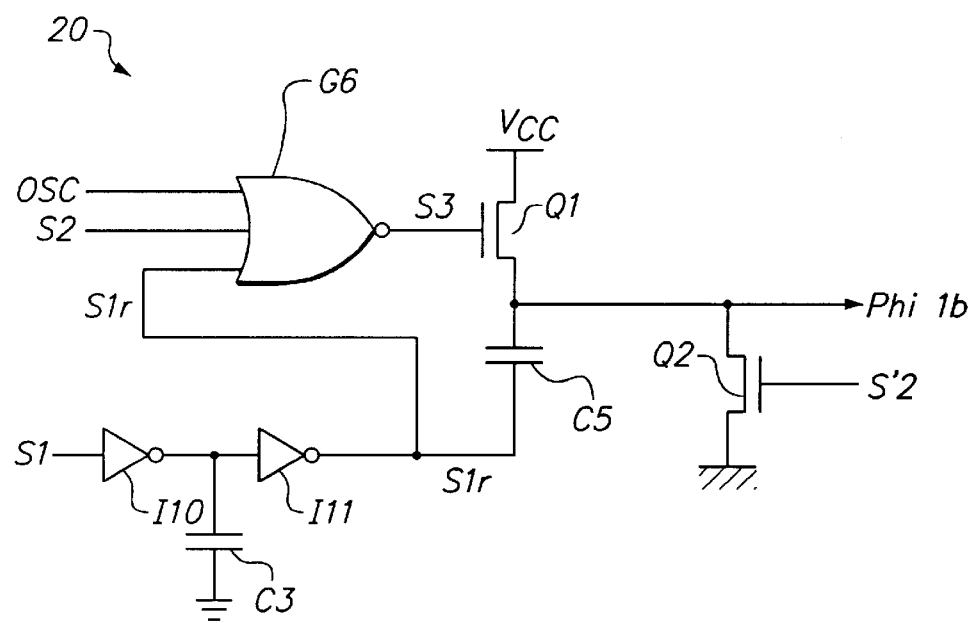
FIG. 2 is a schematic diagram of another conventional circuit for generating a boosted voltage.

As explained above, the circuit 100 provides at the output terminal OUT a boosted voltage equal to twice the supply voltage $V_{DD}$. The ability to generate a boosted voltage equal to twice the supply voltage is especially useful for low supply voltages, e.g., where $V_{DD}$ is less than 1.5 volts. As mentioned earlier, the performance of conventional circuits for generating a boosted voltage wanes when employed in low voltage applications. For instance, the circuit disclosed in U.S. Pat. No. 5,589,793 and discussed above with respect to FIG. 2, provides an incrementally decreasing boosted voltage as the supply voltage is reduced. In contrast, present embodiments provide a boosted voltage of approximately twice the supply voltage, irrespective of the supply voltage level. Thus, peripheral circuits, i.e., circuits desired to be driven with a boosted voltage generated in accordance with present embodiments, do not require local voltage boosting. Further, embodiments of the present invention may be fabricated using virtually any standard CMOS or low voltage process, thereby ensuring compatibility with a wide range of peripheral circuits.

The pulse width characteristics of the boosted voltage at the output terminal OUT may be adjusted to meet specific operating characteristics of circuits (not shown) coupled to the output terminal OUT by modifying the logic circuit 200. For instance, the pulse width of the output signal may be increased (decreased) by increasing (decreasing) the period of the clock signal CLK. The portion of the pulse width of the output signal during which the output terminal OUT is at $V_{DD}$ may be increased (decreased) by increasing (decreasing) the time during which nodes B and C remain high and node A remains low while decreasing (increasing) the time during which node D is high. In a similar manner, the portion of the pulse width of the output signal during which the output terminal OUT is at $2V_{DD}$ may be increased (decreased) by increasing (decreasing) the time during which node D is high and decreasing (increasing) the time during which nodes B and C are high and node A is low. Such modifications to the logic circuit 200 will be apparent to those skilled in the art after reading this disclosure.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A circuit for generating at an output terminal thereof a boosted voltage, said circuit comprising:
    a logic circuit having an input terminal coupled to receive a clock signal and generating first, second, and third control signals in response thereto;
    a voltage regulator circuit having a first terminal coupled to receive said first control signal and, in response thereto, providing a regulated voltage on a second terminal thereof;
    a bootstrap capacitor having a first terminal coupled to receive said second control signal and having a second terminal coupled to said output terminal; and
    a pull-up/pull-down circuit having a first terminal coupled to receive said third control signal, a second terminal coupled to receive said regulated voltage, and a third terminal coupled to said output terminal,
    wherein said pull-up/pull-down circuit pulls said output terminal to a supply voltage when said third control signal is in a first state and said bootstrap capacitor boosts said output terminal to said boosted voltage when said second control terminal is in a second state, said boosted voltage being equal to twice said supply voltage, said regulated voltage preventing said pull-up/pull-down circuit from clamping said output terminal.

2. The circuit of claim 1, wherein said voltage regulation circuit comprises:
    a pull-up transistor coupled between said voltage supply and said second terminal of said pull-up/pull-down circuit and having a gate coupled to receive said first control signal; and
    a gate-boost capacitor having a first terminal coupled to receive said first control signal and having a second terminal coupled to said second terminal of said pull-up/pull-down circuit.

3. The circuit of claim 2, wherein said pull-up/pull-down circuit comprises:
    a second pull-up transistor having a first terminal coupled to said supply voltage and having a gate coupled to receive said third control signal;
    a pass transistor coupled between a second terminal of said second pull-up transistor and said output terminal and having a gate coupled to receive said regulated voltage; and
    a pull-down transistor coupled between said output terminal and ground potential and having a gate coupled to receive said third control signal.

4. The circuit of claim 3, wherein said gate-boost capacitor comprises an MOS transistor having a commonly coupled source and drain.

5. The circuit of claim 3, wherein said bootstrap capacitor comprises an MOS transistor having a commonly coupled source and drain.

6. The circuit of claim 3, wherein said second pull-up transistor comprises a PMOS device and said pull-down transistor comprises an NMOS device.

7. The circuit of claim 3, wherein said logic circuit includes a flip-flop configured as a divide-by-two device.

8. A circuit for generating at an output terminal thereof a boosted voltage, said circuit comprising:
    a logic circuit having an input terminal coupled to receive a clock signal and generating first, second, and third control signals in response thereto;
    a pull-up transistor having a first terminal coupled to a supply voltage;
    a pass transistor coupled between a second terminal of said pull-up transistor and said output terminal, said pass transistor having a gate coupled to receive a regulated voltage;
    a pull-down transistor coupled between said output terminal and ground potential, said pull-down transistor having a gate coupled to receive said first control signal;
    a voltage regulation circuit having a first terminal outputting the regulated voltage and a second terminal coupled to receive said second control signal; and
    a bootstrap capacitor having a first terminal coupled to said output terminal and a second terminal coupled to receive said third control signal;
    wherein said pull-up transistor, said pass transistor and said pull-down transistor pull said output terminal to said supply voltage when said third control signal is in a first state and said bootstrap capacitor boosts said output terminal to said boosted voltage when said second control signal is in a second state, said boosted voltage being equal to twice said supply voltage, said regulated voltage preventing said pull-up transistor, said pass transistor and said pull-down transistor from clamping said output terminal.

9. The circuit of claim 8, wherein said gate of said pull-down transistor is coupled to a gate of said pull-up transistor.

10. The circuit of claim 8, wherein said pull-up transistor comprises a PMOS device and said pull-down transistor comprises an NMOS device.

11. The circuit of claim 8, wherein said bootstrap capacitor comprises an MOS transistor having a commonly coupled source and drain.

12. The circuit of claim 8, wherein said voltage regulation circuit comprises:
    a second pull-up transistor coupled between said voltage supply and said first terminal of said voltage regulation circuit; and
    a capacitor having a first terminal coupled to said gate of said pass transistor and having a second terminal coupled to a gate of said second pull-up transistor and coupled to receive said second control signal.

13. The circuit of claim 12, wherein said second pull-up transistor comprises a PMOS device.

14. The circuit of claim 12, wherein said capacitor comprises an MOS transistor having a commonly coupled source and drain.

15. The circuit of claim 8, wherein said logic circuit includes a flip-flop configured as a divide by two device.

16. A circuit for generating at an output terminal thereof a boosted voltage, said circuit comprising:
- a logic circuit for generating first, second, and third control signals in response to an input clock signal;
- means for selectively coupling said output terminal to a supply voltage and to ground potential in response to said first control signal;
- means for isolating said output terminal from said voltage supply in response to said second control signal;
- means for regulating operation of said means for isolating; and
- means for boosting said output terminal to a voltage approximately twice the supply voltage in response to said third control signal.

17. The circuit of claim 16, wherein said means for selectively coupling comprises:
- a pull-up transistor coupled between said supply voltage and said output terminal; and
- a pull-down transistor coupled between said output terminal and ground potential.

18. The circuit of claim 17, wherein said means for isolating comprises a pass transistor coupled between said pull-up transistor and said output terminal.

19. The circuit of claim 18, wherein said means for regulating comprises:
- a second pull-up transistor coupled between said voltage supply and a control terminal of said pass transistor; and
- a capacitor having a first terminal coupled to said control terminal of said pass transistor and having a second terminal coupled to a gate of said second pull-up transistor.

20. The circuit of claim 19, wherein said means for boosting comprises a bootstrap capacitor having a first terminal coupled to said output terminal and a second terminal coupled to receive said third control signal.

* * * * *